United States Patent [19]

Yamamoto et al.

[11] Patent Number: 4,740,809
[45] Date of Patent: Apr. 26, 1988

[54] OPTICAL PRINTING SYSTEM

[75] Inventors: Takemi Yamamoto; Ryohei Komiya; Ichiro Sasaki; Kouji Kobayakawa; Akira Sago, all of Aichi, Japan

[73] Assignee: Brother Kogyo Kabushiki Kaisha, Aichi, Japan

[21] Appl. No.: 33,331

[22] Filed: Mar. 31, 1987

[30] Foreign Application Priority Data

Apr. 1, 1986 [JP] Japan .................................. 61-76282
Jul. 9, 1986 [JP] Japan .......................... 61-105432[U]
Jul. 25, 1986 [JP] Japan ................................ 61-175897

[51] Int. Cl.$^4$ ...................... G03B 27/32; G03B 27/52
[52] U.S. Cl. ...................................... 355/27; 355/100; 430/138
[58] Field of Search .................... 355/27, 32, 100, 133; 430/211, 235, 962, 138; 354/297

[56] References Cited

U.S. PATENT DOCUMENTS

| | | | |
|---|---|---|---|
| 4,448,516 | 5/1984 | Arney et al. | 355/27 |
| 4,494,865 | 1/1985 | Andrus et al. | 355/32 |
| 4,624,560 | 11/1986 | Beery | 355/27 |
| 4,648,699 | 3/1987 | Holycross et al. | 355/27 X |

Primary Examiner—Richard A. Wintercorn
Attorney, Agent, or Firm—Kane, Dalsimer, Sullivan, Kurucz, Levy, Eisele and Richard

[57] ABSTRACT

In an optical printing system for printing an image on a recording sheet, adopted as the recording sheet is a sheet coated with microcapsules on one surface thereof. Each microcapsule envelopes a first component which changes color when reacts with a second component. The second component may be coated on the recording sheet or may be coated on a separate developing sheet. The microcapsule further envelopes a third component which varies the mechanical strength of microcapsule when light is projected thereto. An image is formed on the recording sheet by selectively exposing a light thereto in accordance with the image to be printed thereon, and the microcapsules on the recording sheet whose mechanical strength is low are then ruptured by rupturing means. Thereby, the color is developed or the recording sheet on the separate developing sheet by the reaction of the first component with the second component.

16 Claims, 7 Drawing Sheets

OPTICAL PRINTING SYSTEM

BACKGROUND OF THE INVENTION

This invention relates to an optical printing system capable of printing characters, patterns or the like by using light.

Printers utilized in computers or the like are classified into various types according to their printing systems. Use of photoprinters has been increased in recent years because of their high printing speed and low operating noise. As the apparatus of this type, those utilizing electrophotographic technique are used in most cases. According to the electrophotographic technique, an image of a character or a pattern is formed on a charged photosensetive member by utilizing a suitable optical system, powders of colored resin called toner is adhered to the not-irradiated portion on the photosensitive member that is the portion still retaining charge, the adhered powders are transferred onto a copying paper, and then the transferred powder image is fixed to obtain a copy.

The photoprinter described above requires to use a photoconductor, a toner applying apparatus and a heat fixing device of the toner. Moreover, as the toner is a consumptive material it is necessary to always store and supplement the toner. For this reason, the construction of the apparatus becomes complicated and the maintenance thereof is troublesome.

There has also been used a photocolor printer in which colored characters or picture images are printed on a photo and pressure sensitive sheet by photo-signals such as laser photo-signals.

A laser printer of a well known construction is illustrated in FIG. 7. As shown, the laser printer comprises a laser beam oscillator 301, a modulator 302, a polygonal scanning mirror 303, a fθ lens 305, a photosensitive drum 306 including charging device 307, a toner developing device 308, a transferring device 309 and a charge removing and cleaning device 310. A recording paper 311 is passed between the photosensitive drum 306 and the transferring device 309 and guided to the fixing device 312. In this printer, the laser beam emitted by the laser beam oscillator 301 is turned ON and OFF by the modulator 302 in accordance with character or picture image informations outputted from a control unit contained in the printer. The photo-signals thus formed are projected upon the photosensitive drum 306 through the scanning mirror 303 and the fθ lens 305 so as to form an electrostatic latent image on the photosensitive drum 306 corresponding to the outputted informations. Then, the toner is caused to adhere to the electrostatic latent image on the drum 306 and the resulting toner image is transferred onto the recording paper 311 and then fixed by the fixing device 312. In this prior art laser printer, character or picture images of only a single color can be recorded. An ordinary paper is used as the copying paper and the toner is caused to adhere onto the paper to print the character or the picture images. Consequently, resolution is low and the photosensitive drum and other accessories complicate the construction of the printer.

In a color printer other than the laser printer described above multicolor toners (for example, red, green and blue colors) or color ink ribbons are used to obtain a print of all colors. With such color printing system, however, as it is necessary to print the same portion of the recording paper by the times the same as the number of colors. Accordingly, the printing speed becomes low.

SUMMARY OF THE INVENTION

It is therefore an object of this invention to provide a novel optical printing system which is not necessary to use toners, has a high resolution, can record characters and picture images at a high speed, with simple construction.

Another object of this invention is to provide an optical printing system in which a photo-image transmitted through or reflected by a manuscript and a photo-image produced by character or pattern informations are selectively projected upon a photo and pressure sensitive recording sheet.

According to this invention there is provided an optical printing system for printing an image on a recording sheet, the improvement which comprises in that the recording sheet is coated with microcapsules on one surface thereof, each microcapsule enveloping a first component which changes color when reacts with second component, the microcapsule further enveloping a third component which varies the mechanical strength of microcapsule when light is profected thereto, and that the printing is carried out by means for selectively exposing a light against the one surface of the recording sheet in accordance with an image to be printed, and means for rupturing the microcapsules whose mechanical strength is low.

According to a modification of this invention there is provided an optical printing system for printing an image on a recording sheet, the improvement which comprises in that the recording sheet comprises a supporting sheet, and a plurality of microcapsules respectively containing color developing agents sensitive to lights of different wavelengths, the microcapsules being uniformly coated on a supporting sheet for preparing a photo and pressure sensitive sheet, and that the printing is carried out by a plurality of light sources respectively emitting lights of wavelength regions sensible by the respective microcapsules, means for causing the light sources to generate photo-signals in accordance with character or pattern image informations, and means for scanning the recording sheet with the photo-signals thereby recording a character or a pattern image on the recording sheet.

BRIEF DESCRIPTION OF THE ACCOMPANYING DRAWINGS

DESCRIPTION OF THE PREFERRED EMBODIMENTS

Figure 1:
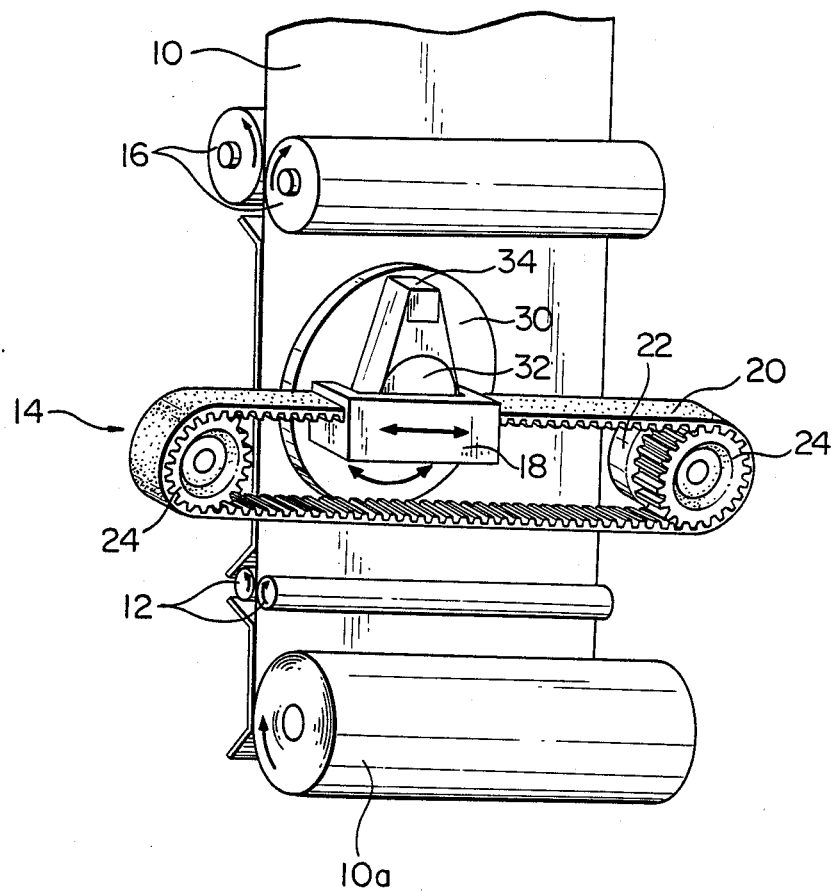
FIG. 1 is a perspective view showing principal portions of a photoprinter utilizing a transparent printing types and embodying the invention.

FIG. 1 shows principal parts of a photoprinter utilizing a printing-type wheel 30, on the peripheral portion of which a font of type characters are formed as being transparent. The printer comprises a pair of sheet feed follers 12 for upwardly feeding a photosensitive recording sheet 10 from a roll 10a, an exposing device 14 for exposing a light against the sheet 10 in accordance with a shaped of a selected type character on the wheel 30, a pair of press rollers 16 for applying a pressure to the exposed sheet 10. Although not shown, the pressed sheet 10 is then sent to a conventional developing device and a fixing device.

The exposing device 14 comprises a carriage 18, an endless belt 20 with teeth on the inner surface which supporting the carriage 18 and extending in a direction perpendicular to the direction of movement of the photosensitive recording sheet 10, and an electric motor 22 for driving the endless belt 20 through gears 24. The carriage 18 is provided with the transparent printing type wheel 30 disposed in parallel with the recording sheet 10, and a lamp 34 is disposed to illuminate only one type character.

The photoprinter shown in FIG. 1 operates as follows. In response to a printing instruction, the character selection motor 32 rotates the transparent printing type wheel 30 and stops the same when a desired type character is brought to the position of the lamp 34. Then, it is turned on to project a light upon the photosensitive recording sheet 10 through the selected transparent type character. After that, the carriage 18 is moved to the next printing position at which the next exposure is performed. When the exposure of one line completes, the photosensitive recording sheet 10 is moved upwardly by a distance corresponding to one line. Then the carriage 18 is moved in the opposite direction for exposing the next one line.

Figure 2A:
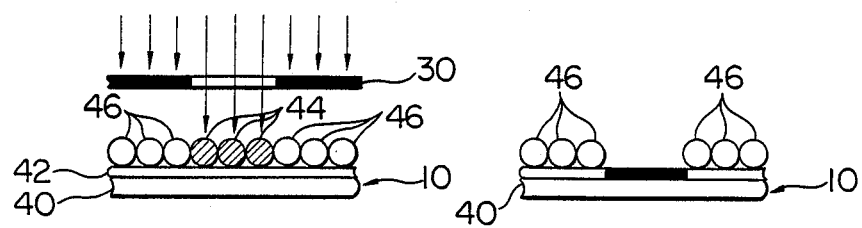
FIGS. 2A through 2D are diagrams showing the construction of a photosensitive recording sheet and explaining development and fixing treatments.
Figure 2B:
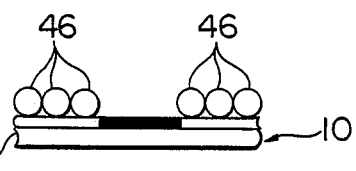

The development and fixing of the photosensitive recording sheet 10 after passing through the press rollers 16 are carried out as follows. As the photosensitive recording sheet 10 comprises, as shown in FIGS. 2A and 2B, a sheet of paper 40 used as the supporting member and microcapsules are uniformly layed on the paper 40. Each microcapsule contains a dye precusor (for example Triallylmethane compound) and photo-softenable resin (for example 3-oxyamino-2-butanon methacrylate). The paper sheet 40 is futher coated with a layer 42 of a chromogenic material, for example an organic acid, which react with the dye precursor to develop a color. With this construction, only the microcapsules 44 irradiated with Xenon light transmitting through a serected transparent type character of the transparent printing type wheel 30 become soft, whereas microcapsules 40 not irradiated with Xenon light still maintain the initial hard state. Consequently, by the pressure applied by press rollers 16, only the softened microcapsules are crushed so that only the portions of the paper sheet 40 corresponding to characters are colored. This is an example of printing characters on an ordinary paper sheet.

Figure 2C:
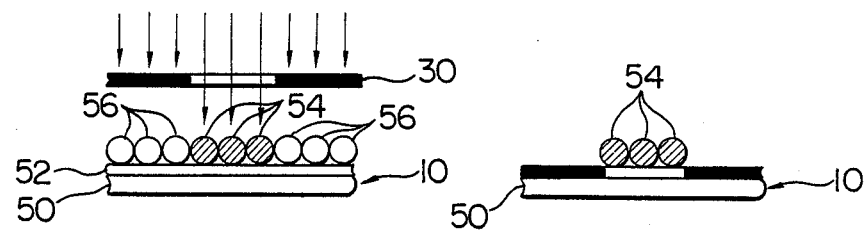
Figure 2D:
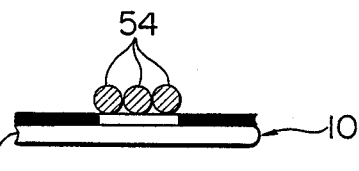

In another example shown in FIGS. 2C and 2D, a film 50 is used as the supporting member. In this example, each microcapsule contains a dye precursor, a photo-curable resin (for example such photopolymer as Torimethylpropane), and a photo-polymerizing initiator (for example Benzophenone) and a chromogenic material 52 is coated on the film 50. One example of such photosensitive recording sheet 10 is described in the U.S. Pat. Nos. 4,399,209 or 4,440,846. Where the microcupsules on the recording sheet 10 irradiated with light are hardened as shown in FIG. 2C, whereas those not irradiated are not hardened. When applied with pressure by the press rollers 16, only the unhardened microcapsules are crushed thus forming a negative image on the recording sheet 10 corresponding to the selected transparent type character of the printing type wheel 30. Hardened microcapsules 54 are not crushed so that the printed character image can be developed. The developed character image can be used to form a manuscript negative film for producing a plurality of copies.

Instead of coating a chromogenic material on a paper sheet or film, the paper sheet or film may be colored beforehand, and a decolorizing agent such as a bleaching agent may be enveloped in the microcapsules instead of the dye precursor. Then a positive image can be obtained.

Further, instead of the printing type wheel 30 as above described, the printing type wheel having a font of type characters formed to shield a light while the remaining portions thereof being formed to transmit a light there through can be used. In this case, a negative image is printed on the recording sheet.

As above described, where the photoprinter of this embodiment is used with a photosensitive recording sheet of a desired type, a positive or negative printed character image can readily be obtained. Moreover, since no photoconductor is used and no consumptive material other than recording sheet is required, the construction of the apparatus becomes simple and supplement of the consumptive material is not necessary.

Figure 3:
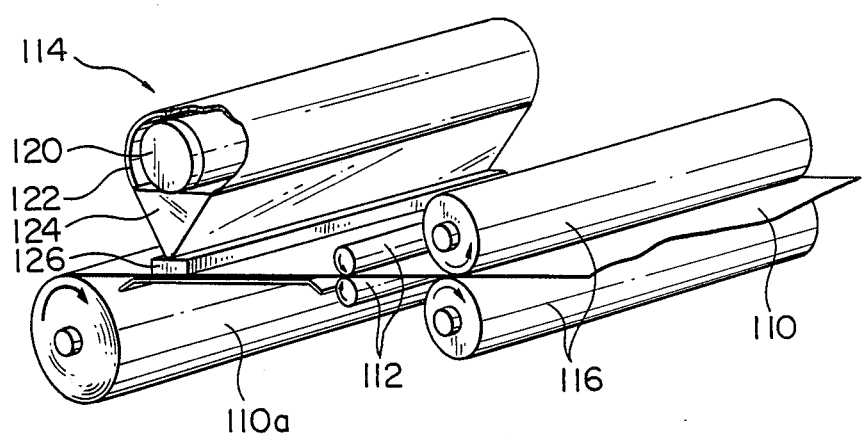
FIG. 3 is a perspective view showing principal parts of the photoprinter according to the second embodiment of the invention.

FIG. 3 shows a photoprinter utilizing a liquid crystal shutter array. The construction of the second embodiment shown in FIG. 3 is generally similar to the first embodiment shown in FIG. 1. In the embodiment shown in FIG. 3, a photosensitive recording sheet 110 paid out from a roll 110a is sent toward right as viewed in FIG. 3 by a pair of pinch rollers 112. After being exposed to light by the exposing device 114, the recording sheet 110 is pressed by a pair of press rollers 116 and then developed and fixed.

At the exposing device 114, ultraviolet ray emitted by a ultraviolet ray lamp 120 is concentrated as a straight line on the liquid crystal shutter array 126 by a reflection mirror 122 and a condensor prism 124. In response to a printing instruction, the liquid crystal shutter array 126 transmits or intercepts the ultraviolet ray along the straight line with predetermined small intervals. By performing a dot shaped exposure on the straight line while the photosensitive recording sheet 110 is being moved, exposure can be made in the form of a desired character or pattern. The exposed recording sheet 110 can be developed and fixed in the same manner as above described.

Figure 4:
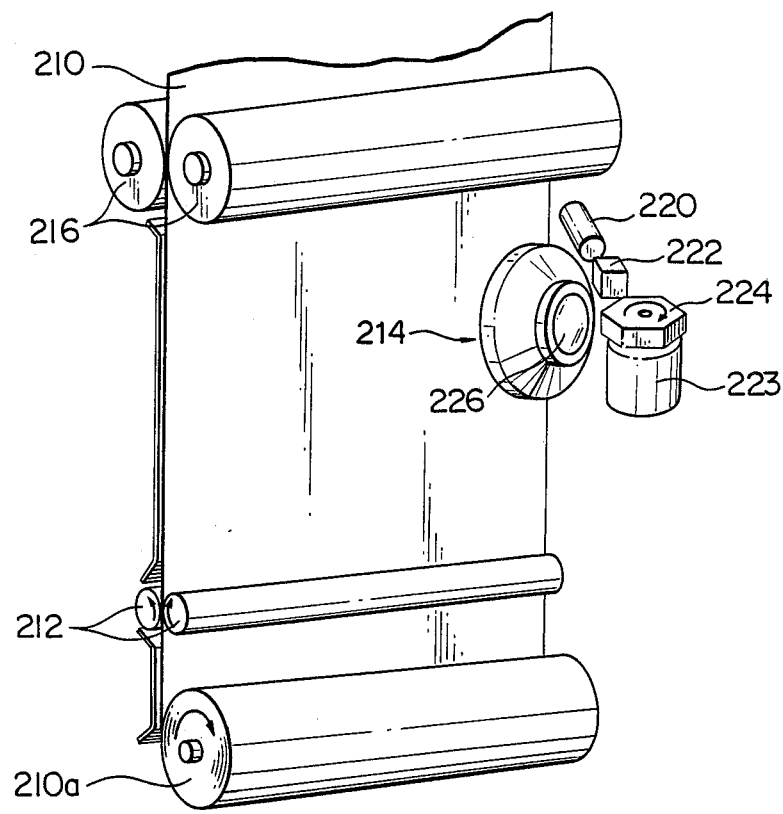
FIG. 4 is a perspective view of a laser printer according to a third embodiment of the invention.

A laser beam printer shown in FIG. 4 is the third embodiment of this invention. The construction of this embodiment is generally the same as that of the first embodiment. More particularly, a photosensitive recording sheet 210 paid out from a roll 210a is sent upwardly as viewed in FIG. 3 by a pair of feed rollers 212. After exposed to light by an exposing device 214, the recording sheet 210 is pressed by a pair of press rollers 216 located on the upper side and then developed and fixed.

At the exposing device 214, laser beam emitted by a laser beam source 220 is modulated by an acoustic optical modulator 222 in accordance with a control signal and then scanned in the transverse direction of the recording sheet 210 by a polygonal mirror 224 driven by an electric motor 223. The variation on the optical path length is compensated for by a $f\theta$ lens 226 by adjusting the focal length thereof whereby the recording sheet 210 is exposed to light in the desired form of characters and patterns. The development and fixing of the exposed recording sheet are performed in the same manner as in the first embodiment.

In addition to the foregoing embodiments the invention can be applied to various types of the optical printer.

Furthermore in the foregoing embodiments the photosensitive recording sheet optically printed with characters or patterns is applied with mechanical pressure by press rollers so as to rupture the microcapsules. Alternatively the microcapsules can by ruptured by thermal, electrical, physical and chemical means. For example, a substance that swells or expands due to heat can be enveloped in the microcapsules or they can be broken by electric discharge. Furthermore the shells of the microcapsules can be made of a substance that can be dissolved by physical or chemical means.

As above described, the photoprinter of this invention does not require a photoconductor, toner applying apparatus and thermal fixing device of the toner. Moreover, as any consumptive material other than the toner is not used, the construction and maintainance of the apparatus can be simplified.

Figure 5:
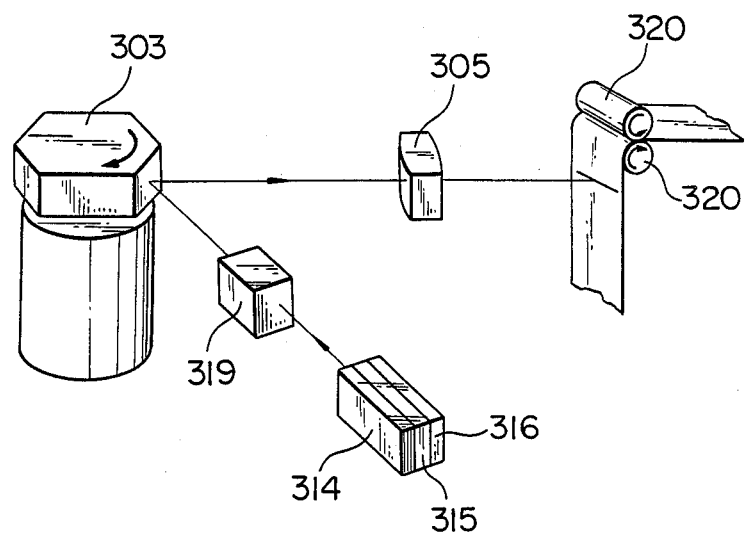
FIG. 5 is a diagrammatic representation of the laser printer according to the invention.

FIG. 5 shows a fourth embodiment of this invention in which elements corresponding to those shown in FIG. 1 are designated by the same reference numerals. In this embodiment, a special photo and pressure sensitive sheet 313 is used as a recording paper in which various kinds of microcapsules respectively containing cyan color developing agent, a magenta color developing agent, and a yellow color developing agent. These agents having different photosensitive wavelength regions are mixedly and uniformly coated on a sheet or paper. More particularly, as the photo and pressure sensitive paper are known a self-color-developing type and a transfer printing type. In this embodiment, the former type is used. In the so called self-color-developing type photo and pressure sensitive sheet, the cyan, magenta and yellow color developing agents are contained in discrete microcapsules together with a photosensitive resin, a polymerizing initiator, and a photosensitizing agent, and mixture of the microcapsules and a chromogenic material is uniformly coated on a paper sheet. With the self-color-developing type photo and pressure sensitive sheet, by irradiating the microcapsules with lights having wavelengths sensed by cyan, magenta and yellow respectively, corresponding microcapsules are hardened. Thereafter, when the photo and pressure sensitive sheet is passed between pressure rollers 320 to rupture unhardened microcapsules the color developing agents such as cyan etc. reacts with the chromogenic material to develop desired colors.

Figure 6:
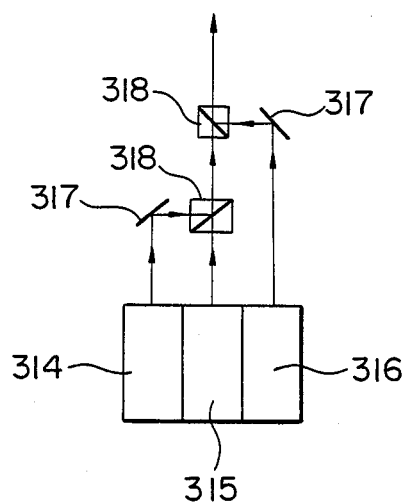
FIG. 6 is a plan view showing the laser beam oscillator shown in FIG. 5.
Figure 7:
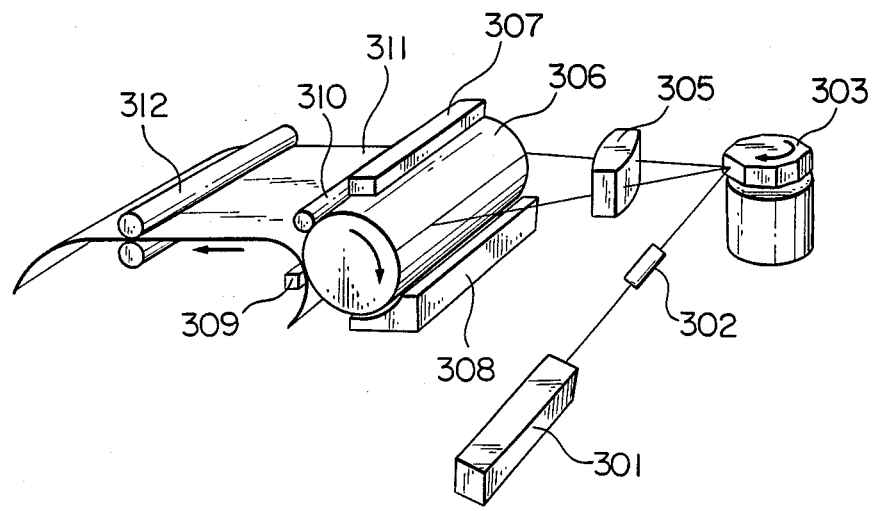
FIG. 7 is a diagrammatic representation showing a prior art laser printer.

Assume now that the spectrum sensitivity characteristic of the photo and pressure sensitive sheet has a peak sensitivity for cyan color at a wavelength of 650 mm, a peak sensitivity for magenta color at a wavelength of 550 mm, and a peak sensitivity for yellow color at a wavelength of 400 mm, the laser light oscillator is constituted by a cyan oscillar 314 producing cyan light having a wavelength of 650 mm sensible by the cyan microcapsules, a magenta oscillator 315 producing magenta light having a wavelength of 550 mm sensible by the magenta microcapsules and a yellow oscillator 316 producing yellow light sensible by the yellow microcapsules. The beams emitted by respective oscillators 314,315 and 316 are gathered together, as illustrated in FIG. 6, through total reflection mirror 317 and half mirrors 318, and then projected upon a polygonal scanning mirror 303 through a condenser lens 319. The laser beam reflected by the scanning mirror 303 is used to directly scan the photo and pressure sensitive sheet 313 through $f\theta$ lens 305. After irradiation, the sheet 313 is passed between press rollers 320.

To produce a color print by using the photoprinter described above, oscillators 314, 315 and 316 are ON/OFF controlled by printing or picture image informations issued by a control unit, not shown, contained in the printer. For example, where only the cyan oscillator 314 is turned ON while magenta and yellow oscillator 315 and 316 are turned OFF, only the cyan microcapsules are hardened. As a consequence, magenta and yellow microcapsules are ruptured by the press rollers 320 whereby the color developing agents contained in the crushed microcapsules react with the chromogenic material to dovelop red color corresponding to a mixture of magenta and yellow colors. In the same manner, when only the magenta oscillator 315 is turned ON while cyan and yellow oscillators 314 and 316 are turned OFF, the cyan and yellow microcapsules are ruptured by press rollers 320, thereby developing green color. Furthermore, when only the yellow oscillator 316 is turned ON while cyan and magenta oscillators 314 and 315 are turned OFF, blue color is developed. When cyan and magenta oscillators 314 and 315 are turned ON while the yellow oscillator 316 is turned OFF, only the yellow microcapsules are ruptured so that yellow color is developed. In the same manner, cyan or magenta color can be developed. When cyan, magenta and yellow oscillators 314, 315 and 316 are all turned ON, since no microcapsule is ruptured, the photo and pressure sensitive sheet remains white. On the other hand, when cyan, magenta and yellow oscillators 314, 315 and 316 are turned OFF, all microcapsules are ruptured thereby developing black color, that is a mixture of three original colors.

In the transfer printing type photo and pressure sensitive sheet described above, three color (cyan, magenta and yellow) developing agents are enveloped respectively in different microcapsules and these capsules are coated on a paper sheet. Regarding the chromogenic material it is coated on a separate transfer printing paper. After exposing the photo and pressure sensitive sheet it is superposed on the transfer printing paper and unhardened microcapsules on the photo and pressure sensitive sheet and crushed by press rollers 320. As a consequence, color developing agents react with the chromogenic material on the transfer printing paper thereby recording characters or pattern images on the transfer printing paper.

As above described with the photoprinter of this modification, characters or pattern images of any desired color can be recorded on a photo and pressure sensitive sheet coated with microcapsules respectively containing cyan, magenta and yellow color developing agents. Moreover, when cyan, magenta and yellow laser oscillators 314,315 and 316 are simultaneously controlled a color print can be made at a time, thereby increasing the recording speed. Moreover since it is not necessary to use a toner for recording on the photo and pressure sensitive sheet not only a high resolution can be obtained but also such accessories as a photosensitive drum is not necessary, so that construction can simplified and the manufacturing cost can be reduced.

Figure 8:
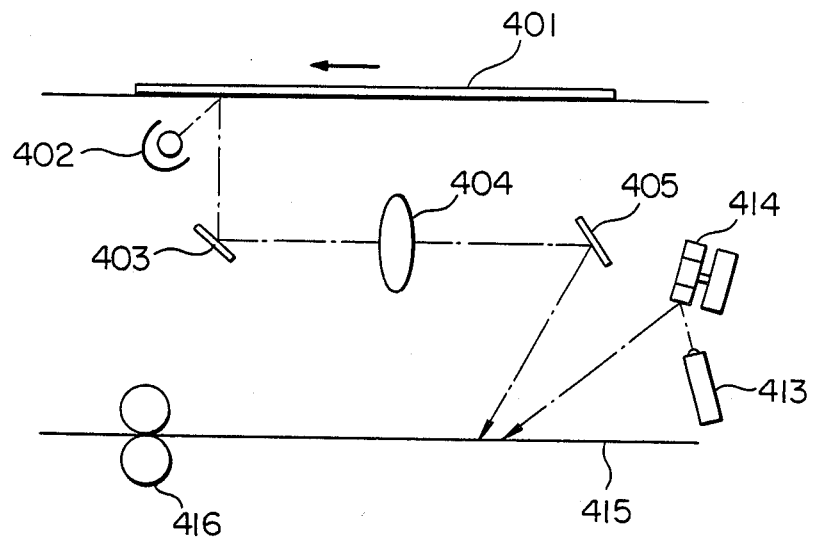
FIGS. 8 and 9 are diagrammatic representations showing further modifications of the invention in which a photo-image transmitting through or reflected by a manuscript and a photo-image produced by a character or pattern information are selectively projected upon a photo and pressure sensitive recording sheet.
Figure 9:
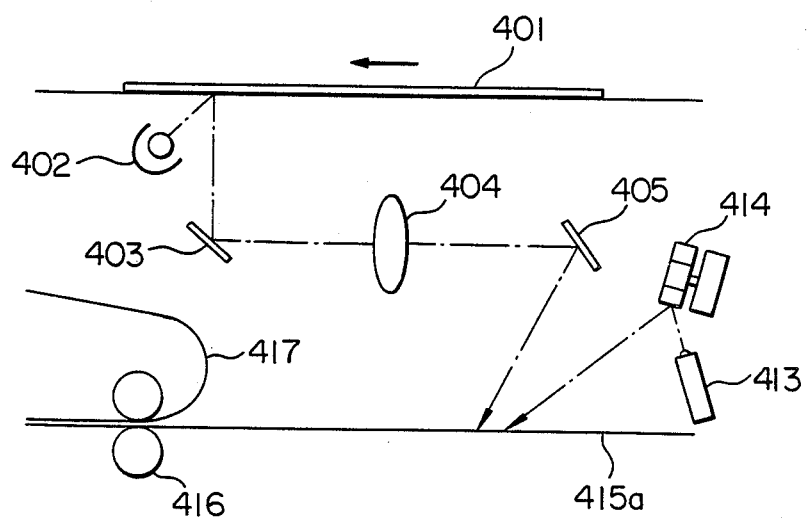

FIGS. 8 and 9 show yet other embodiments of this invention in which either one of the light reflected by a manuscript or light transmitting through a photograph film, and light controlled in accordance with a character or pattern image information is selectively projected on the photo and pressure sensitive recording sheet of the type described above.

More particularly, in the embodiment shown in FIG. 8, a self-color-developing type photo and pressure sensitive recording sheet 415 which is prepared by uniformly coating, on a paper sheet, a mixture of microcapsules containing photo-curable type dye precursor, and chromogenic materials. As the microcapsules irradiated by light is hardened whereas those not-irradiated with light are crushed by press rollers 416 so that the dye precursor reacts with the chromogenic materials to develop color, thus forming a color picture image.

In this embodiment, light emitted by a light source 412 and reflected by a manuscript 401 is projected on the photo and pressure sensitive recording sheet 415 through reflecting mirrors 403,405 and a condenser lens 404. Instead of the light reflected by the manuscript, laser beam generated by a laser oscillator 413 and controlled by a character or a picture image information is projected on the photo and pressure sensitive recording sheet 415 through a rotary mirror 414, thereby increasing the versatility of the photoprinter.

The embodiment shown in FIG. 9 is different from that shown in FIG. 8 in that the photo and pressure sensitive recording sheet 415a is coated with microcapusules while a separate developing sheet 417 coated with chromogenic materials are simultaneously passed through press rollers 416 so as to cause the dye precursor in the crushed microcapsules to react with the chromogenic materials on the developing sheet 417 to form a color picture image.

What is claimed is:

1. An optical printing system for printing an image on a recording sheet, the improvement which comprises in
that said recording sheet is coated with microcapsules on one surface thereof, each said microcapsule enveloping a first component which changes color when reacts with second component, said microcapsule further enveloping a third component which varies the mechanical strength of microcapsule when light is projected thereto; and
that said printing being carried out by means for selectively exposing a light against said one surface of the recording sheet in accordance with an image to be printed on said recording sheet, and means for rupturing the microcapsules whose mechanical strength is low.

2. The optical printing system according to claim 1 wherein said first component is a dye precursor, said second component is a chromogenic material, and said third component is a photo-softenable resin.

3. The optical printing system according to claim 1 wherein said first component is a dye precursor, said second component is a chromogenic material, and said third component is a photo-curable resin and photo-polymerizing initiator.

4. The optical printing system according to claim 1 wherein said first component is a decolorizing agent while said second component is a dye which colors said one surface of the recording sheet.

5. The optical printing system according to claim 1 wherein said microcapsule further envelopes a substance swelled by heat.

6. The optical printing system according to claim 1 wherein shells of said microcapsule are made of a meltable substance.

7. The optical printing system according to claim 1 wherein said exposure means comprises a belt driven in a direction perpendicular to a direction of movement of said recording sheet, a carriage secured to said endless belt, and a printing type wheel carried by said carriage, said printing type wheel is provided with a printing type font about a periphery of said wheel.

8. The optical printing system according to claim 1 wherein said microcapsules are coated on a layer of said second component on said recording sheet.

9. The optical printing system according to claim 1 wherein said exposure means comprises a light source, a liquid crystal shutter array disposed on said recording sheet, means for concentrating the light on said liquid crystal shutter array as a straight line, and means responsive to a printing instruction signal for causing said liquid crystal shutter array to transmit or intercept said light with minute intervals thus providing a dot-shaped exposure along said straight line.

10. The optical printing system according to claim 1 wherein said exposure means comprises a laser oscillator, means for modulating laser beam produced by said laiser oscillator in accordance with a control signal, and a polygonal rotary mirror for scanning said modulated laser beam across said recording sheet.

11. The optical printing system according to claim 10 wherein fθ lens is utilized for compensating for variation in a length of an optical path.

12. An optical printing system for printing an image on a recording sheet, the improvement which comprises in
that said recording sheet comprises a supporting sheet, and a plurality of microcapsules respectively containing color developing agents sensitive to lights of different wavelengths, said microcapsules being uniformly coated on said supporting sheet for preparing a photo and pressure sensitive sheet; and
that said printing is carried out by a plurality of light sources respectively emitting lights of wavelength regions sensible by said respective microcapsules, means for causing said light sources to generate photo-signals in accordance with a character or pattern image information, and means for scanning said recording sheet with said photo-signals thereby recording a character or a pattern image on said recording sheet.

13. The optical printing system according to claim 12 wherein said light sources comprise three laser oscillators respectively emitting laser beams having wavelengths sensible by said respective color developing agents contained in said microcapsules.

14. The optical printing system according to claim 13 wherein said laser beams emitted by said three laser oscillators are combined into a single beam by optical means, and said recording sheet is scanned with said single beam.

15. The optical printing system according to claim 1 wherein light reflected by a manuscript or transmitting through a photographic film and light emitted by another light source and controlled by a character or pattern information are selectively projected on said photosensitive recording sheet.

16. The optical printing system according to claim 1 wherein a developing sheet coated with a chromogenic materials is passed with said recording sheet through press rolls in a superposed state.

* * * * *